(12) United States Patent
Fujii et al.

(10) Patent No.: US 7,678,612 B2
(45) Date of Patent: Mar. 16, 2010

(54) METHOD OF MANUFACTURING SEMICONDUCTOR DEVICE

(75) Inventors: Tomoharu Fujii, Nagano (JP); Kiyoshi Oi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 11/898,973

(22) Filed: Sep. 18, 2007

(65) Prior Publication Data

US 2008/0076249 A1 Mar. 27, 2008

(30) Foreign Application Priority Data

Sep. 19, 2006 (JP) .......................... P.2006-252999

(51) Int. Cl.
*H01L 21/00* (2006.01)
(52) U.S. Cl. ................. 438/118; 257/E21.499
(58) Field of Classification Search ................. 438/106, 438/108, 118, 119
See application file for complete search history.

(56) References Cited

U.S. PATENT DOCUMENTS

| | | | | |
|---|---|---|---|---|
| 6,404,643 | B1 * | 6/2002 | Chung | 361/737 |
| 6,429,831 | B2 * | 8/2002 | Babb | 343/895 |
| 7,064,440 | B2 * | 6/2006 | Jobetto et al. | 257/758 |
| 7,095,372 | B2 * | 8/2006 | Castany et al. | 343/700 MS |
| 7,521,283 | B2 * | 4/2009 | Machida et al. | 438/106 |
| 2002/0079591 | A1 * | 6/2002 | Sakiyama et al. | 257/777 |
| 2007/0164414 | A1 * | 7/2007 | Dokai et al. | 257/679 |

FOREIGN PATENT DOCUMENTS

| | | |
|---|---|---|
| JP | 2004-71961 | 3/2004 |
| JP | 2006-108451 | 4/2006 |
| JP | 2006-195918 | 7/2006 |

* cited by examiner

*Primary Examiner*—W. David Coleman
(74) *Attorney, Agent, or Firm*—Drinker Biddle & Reath LLP

(57) ABSTRACT

A method for manufacturing a semiconductor device includes: a step of forming a via plug erected on an electrically conductive layer, and embedding the via plug in an insulation layer to form a wiring structure; and a step of bonding the wiring structure to a wiring substrate including electronic components mounted thereon.

8 Claims, 12 Drawing Sheets

METHOD OF MANUFACTURING SEMICONDUCTOR DEVICE

This application claims priority to Japanese Patent Application No. 2006-252999, filed Sep. 19, 2006, in the Japanese Patent Office. The priority application is incorporated by reference in its entirety.

TECHNICAL FIELD

The present disclosure relates to a method for manufacturing a semiconductor device including active elements and passive elements mounted therein.

RELATED ART

For example, there are various types of semiconductor devices including semiconductor elements such as active elements and passive elements mounted therein. In recent years, for example, semiconductor devices having a radio communication module including a radio frequency (RF) communication unit, a MCU (microcomputer) unit, a quartz oscillator, and the like have often come into use in various situations (see, e.g., Patent Document 1).

FIG. 1 is a view showing the outline of a semiconductor device 30 having a radio communication module. By reference to FIG. 1, the semiconductor device 30 has a structure in which a radio communication module 120 is mounted on a wiring substrate 10.

The wiring substrate 10 has a structure in which a via plug 16 and wiring patterns 17 to 20 are formed in a structure of lamination of insulation layers 11 to 15. On the opposite side (surface) thereof on which a bump 121 is formed, the radio communication module 120 is mounted. The radio communication module 120 includes, for example, an active element 21 connected to a wiring pattern by a bonding wire, and passive elements 22 to 26 mounted around the active element 21.

Further, it is configured such that the active element 21 and the passive elements 22 to 26 are sealed with an insulation layer 27 referred to as a so-called mold resin.

[Patent Document 1] Japanese Patent Unexamined Publication No. 2006-195918

[Patent Document 2] Japanese Patent Unexamined Publication No. 2006-108451

[Patent Document 3] Japanese Patent Unexamined Publication No. 2004-71961

However, with a recent demand for a smaller size/higher performance semiconductor device, there has arisen a necessity of allowing the semiconductor device to have a further smaller size/higher density.

Considering the reduction in size of the semiconductor device, the increase in density of elements to be mounted or addition of elements, or the like, it is conceivable that a method in which a layer such as a wiring layer is further formed as the overlying layer of semiconductor elements is adopted. However, for example, out of the electronic components forming the radio communication module 120, particularly, some of the passive elements 22 to 26 are larger in height from the mounting surface (the surface of the wiring substrate 10) than the active element 21. This makes it difficult to form a structure to be connected via a via plug onto the module of the semiconductor device.

For example, in a radio communication module, in addition to an active element which is the main part, an element for impedance conversion referred to as a balun, and a passive element such as a capacitor are necessary. Thus, the insulation layer 27 for sealing the radio communication module including the passive elements becomes thick.

For this reason, when a via plug penetrating through the insulation layer 27 is formed, the via plug is required to be formed with a high aspect ratio. Thus, unfavorably, the formation of the via plug is difficult with a general plating method. Therefore, it becomes difficult to form a structure to be connected via a via plug as the overlying layer. This is unfavorable for forming the semiconductor device in a multilayer.

SUMMARY

Exemplary embodiments of the present invention provide a novel and useful method for manufacturing a semiconductor device.

Exemplary embodiments of the present invention provide a method for manufacturing a semiconductor device whereby the semiconductor device including electronic components mounted therein is reduced in size.

In accordance with one or more embodiments of the present invention, a method for manufacturing a semiconductor device includes: a step of forming a via plug erected on an electrically conductive layer, and embedding the via plug in an insulation layer to form a wiring structure; and a step of bonding the wiring structure to a wiring substrate including an electronic component mounted thereon.

In accordance with one or more embodiments of the present invention, it becomes possible to reduce the size of a semiconductor device including an electronic component mounted therein.

Further, it is also acceptable that the electronic component includes an active element and an passive element forming a radio communication module.

Still further, it is also acceptable that the electrically conductive layer forms a shield for shielding the radio communication module.

Furthermore, it is also acceptable that the method for manufacturing a semiconductor device further includes a step of patterning the electrically conductive layer, and forming an antenna to be connected to the radio communication module.

Still further, it is also acceptable that the method for manufacturing a semiconductor device further includes a step of patterning the electrically conductive layer, and forming an electrically conductive pattern to be connected to the radio communication module.

Further, it is also acceptable that the method for manufacturing a semiconductor device further includes a step of mounting an electronic component to be connected to the electrically conductive pattern.

Furthermore, it is also acceptable that, in the step of forming the wiring structure, an electrically conductive to-be-etched layer is subjected to pattern etching to form the electrically conductive layer and the via plug.

It is also acceptable that, in the step of forming the wiring structure, a projection-like electrically conductive member is bonded to the electrically conductive layer to form the via plug.

Further, in accordance with one or more embodiments of the present invention, a method for manufacturing a semiconductor device includes: a step of forming a via plug erected on an electrically conductive layer to form a via plug structure; and a step of bonding the via plug structure to a wiring substrate including an electronic component mounted thereon while inserting an insulating layer between the via plug structure and the wiring substrate.

In accordance with one or more embodiments of the present invention, it becomes possible to provide a method for manufacturing a semiconductor device whereby the semiconductor device including an electronic component mounted therein is reduced in size.

Other features and advantages may be apparent from the following detailed description, the accompanying drawings and the claims.

DETAILED DESCRIPTION

A method for manufacturing a semiconductor device in accordance with exemplary embodiments of the present invention includes: a step of forming a via plug erected on an electrically conductive layer, and embedding the via plug in an insulation layer to form a wiring structure; and a step of bonding the wiring structure to a wiring substrate including an electronic component (e.g., an active element, and an passive element larger in height from the mounting surface than the active element) mounted thereon.

Thus, in accordance with exemplary embodiments of the present invention, it becomes easy to form various structures to be connected through the via plug as the overlying layer of a module including elements large in height from the mounting surface. For this reason, for example, it becomes possible to form a structure such as a pattern wiring as the overlying layer of the radio communication module including elements large in height from the mounting surface such as a balun and a capacitor. This enables the reduction in size/increase in density of a semiconductor device.

Exemplary examples of the method for manufacturing the semiconductor device will be described by reference to the accompanying drawings.

EXAMPLE 1

Figure 1:
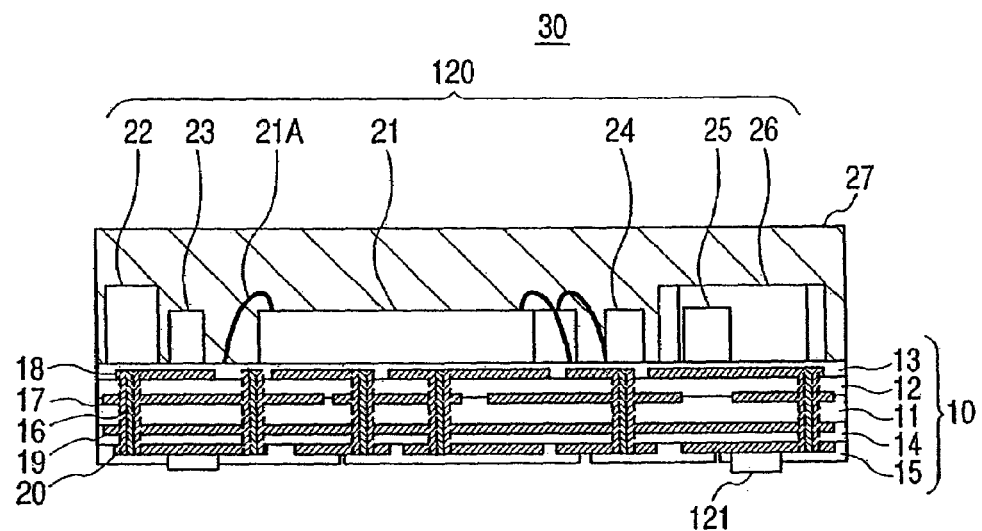
FIG. 1 is a view showing a related-art semiconductor device.
Figure 2:
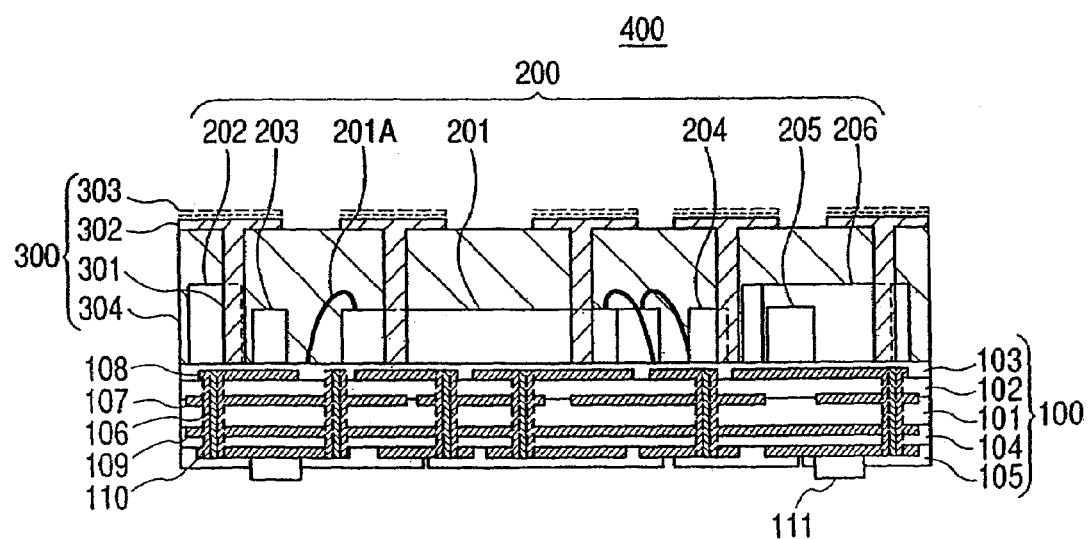
FIG. 2 is a view showing a semiconductor device in accordance with Example 1.

FIG. 2 is a view schematically showing a semiconductor device 400 manufactured by a method for manufacturing a semiconductor device in accordance with Example 1 of the present invention. By reference to FIG. 2, the outline of the semiconductor device 400 shown in this view has a structure in which an active element 201 and passive elements 202 to 206 are mounted as electronic components on a wiring substrate 100.

The wiring substrate 100 has a structure in which insulation layers 102 and 103 are sequentially stacked on the surface side (the side on which the elements are mounted) of an insulation layer 101 formed of a core substrate 101, and insulation layers 104 and 105 are sequentially stacked on the back side of the insulation layer 101. On the back side of the core substrate 101, a bump 111 is also formed. It is configured such that the insulation layers 102 and 104 are formed of, for example, a build-up resin (such as epoxy or polyimide), and such that the insulation layers 103 and 105 are formed of a solder resist layer.

In the insulation layers 102, 103, 104, and 105, pattern wirings 107, 108, 109, and 110 are formed, respectively. Further, the pattern wirings are connected to one another by a via plug 106 penetrating through the insulation layer (core substrate) 101. Thus, it is configured such that a connection between the surface side and the back side of the insulation layer 101 is established.

On the surface side (the side on which the insulation layer 103 is formed) of the wiring substrate 100, the active element 201 and the passive elements 202 to 206 forming a radio communication module 200 are mounted. The active element 201 is connected to the pattern wiring 108 formed on the wiring substrate 100 by, for example, a bonding wire 201A (the connection portion is not shown). Further, the passive elements 202 to 206 are also connected to the pattern wiring 108 (the connection portion is not shown).

In the case of this example, it is a feature that, in the foregoing structure, a wiring structure 300 is bonded and connected to the surface side (the side on which the elements are mounted) of the wiring substrate 100. The wiring structure 300 has a structure having an insulation layer 304, a via plug 301 penetrating through the insulation layer 304, a pattern wiring (electrode pad) 302, to be connected to the via plug 301, and a connection layer 303 formed on the pattern wiring 302.

The side of the via plug 301 opposite to the side connected to the pattern wiring 302 is connected to the pattern wiring 108 of the wiring substrate 100 (the connection portion is not shown). This results in a structure in which the pattern wiring 108 and the pattern wiring 302 are electrically connected via the via plug 301. Further, the insulation layer 304 seals the radio communication module 200 (the active element 201, and the passive elements 202 to 206).

It is a feature that, in the foregoing structure, the wiring structure 300 including the via plug 301 is bonded to the wiring substrate 100 by bonding. Further, when the wiring structure 300 is formed, the via plug 301 is configured so as to be erected on the electrically conductive layer (wiring pattern) not depending on via-fill plating (plating filling up the via hole) as in the related art. After, the shape of the via plug is formed, the via plug is embedded in the insulation layer.

For this reason, with the manufacturing method of this example, it becomes possible to readily form a via plug high in aspect ratio, to be connected to the wiring substrate 100 (radio communication module 200).

Therefore, for example, even when a module including passive elements larger in height from the mounting surface (the insulation layer 103 or the pattern wiring 108) than the active element is mounted, it becomes possible to form a structure to be connected to a wiring substrate such as a pattern wiring as the overlying layer of the module. This performs an effect of enabling the reduction in size/increase in density of a semiconductor device.

Then, the method for manufacturing the semiconductor device 400 will be described step by step by reference to FIGS. 3A to 3G. However, the elements described previously are given the same reference numerals and signs, and the description may be omitted.

Figure 3A:
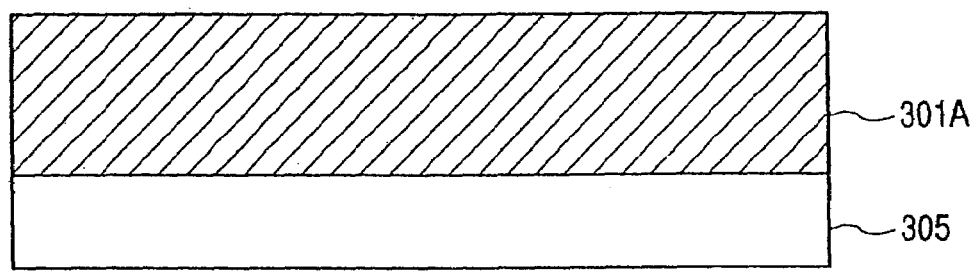
FIG. 3A is a view (first) showing a method for manufacturing the semiconductor device in accordance with Example 1.

First, in a step shown in FIG. 3A, to a to-be-etched layer 301A made of an electrically conductive material such as Cu, a fixing layer 305 formed of a film made of a resin, or the like is bonded.

Figure 3B:
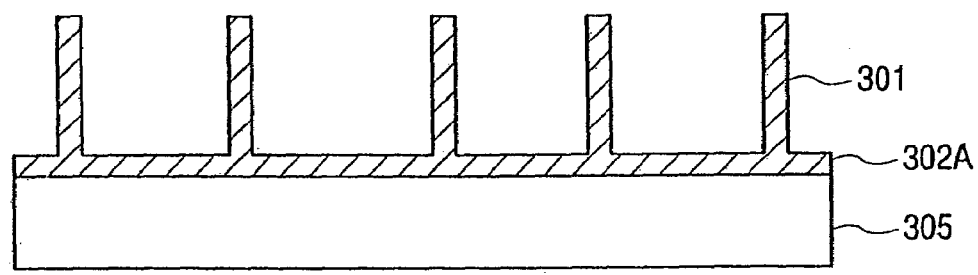
FIG. 3B is a view (second) showing the method for manufacturing the semiconductor device in accordance with Example 1.

Then, in a step shown in FIG. 3B, the to-be-etched layer 301A is subjected to pattern etching by etching (e.g., wet etching) using a prescribed mask pattern (not shown) as a mask to form a via plug 301 erected on an electrically conductive layer 302A. When the mask pattern is formed, a resist layer is formed by bonding of a film, or coating, and then exposed to light/developed for the formation.

Figure 3C:
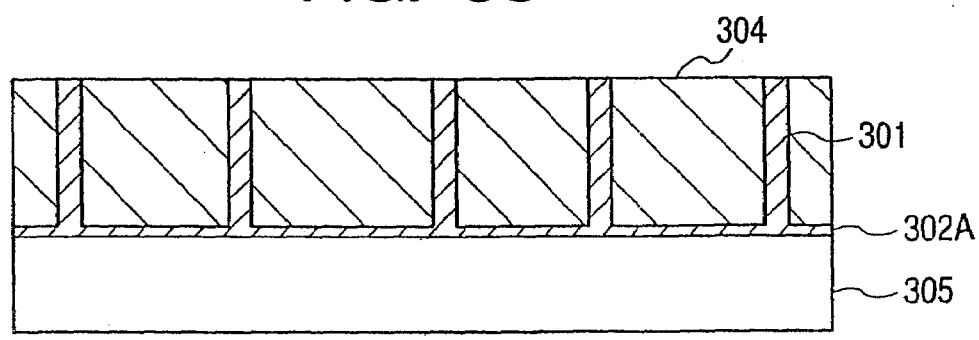
FIG. 3C is a view (third) showing the method for manufacturing the semiconductor device in accordance with Example 1.

Then, in a step shown in FIG. 3C, an insulation layer 304 formed of, for example, a build-up resin (such as an epoxy resin or a polyimide resin) is formed on the electrically conductive layer 302A so as to cover the periphery of the via plug 301. The insulation layer 304 can be formed by, for example, bonding a film resin, or coating a liquid resin. Further, the insulation layer 304 is applied with heat/pressure, thereby to be cured.

Figure 3D:
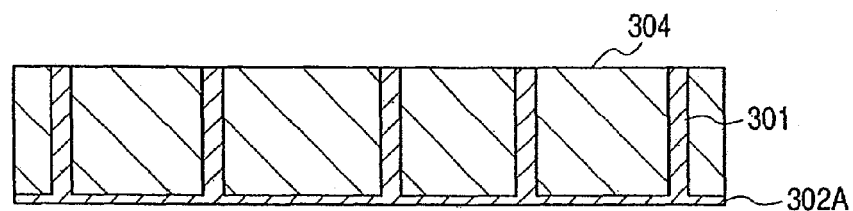
FIG. 3D is a view (fourth) showing the method for manufacturing the semiconductor device in accordance with Example 1.

Then, in a step shown in FIG. 3D, the fixing layer 305 is removed (peeled off). If necessary, the insulation layer 304 and the via plug 301 are polished, so that the tips of the insulation layer 304 and the via plug 301 are substantially on the same plane.

Figure 3E:
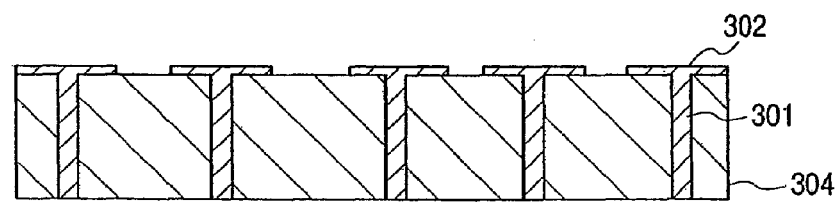
FIG. 3E is a view (fifth) showing the method for manufacturing the semiconductor device in accordance with Example 1.

Then, in a step shown in FIG. 3E, the electrically conductive layer 302A is subjected to pattern etching by etching (e.g., wet etching) using a prescribed mask pattern (not shown) as a mask. Thus, each pattern wiring (electrode pad) 302 connected to its corresponding via plug 301 is formed. When the mask pattern is formed, a resist layer is formed by bonding of a film, or coating, and then exposed to light/developed for the formation.

Figure 3F:
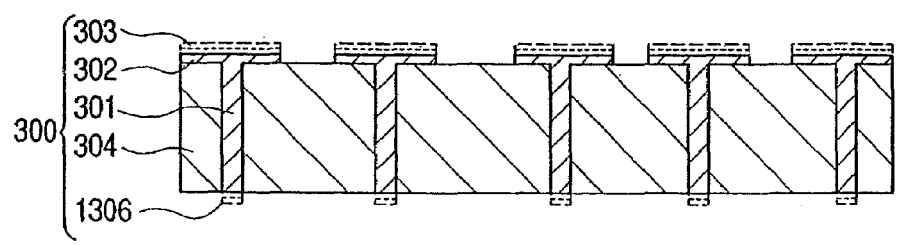
FIG. 3F is a view (sixth) showing the method for manufacturing the semiconductor device in accordance with Example 1.

Then, in a step shown in FIG. 3F, a Ni layer and a Au layer are sequentially formed on the pattern wiring 302 by, for example, a plating method. As a result, a connection layer 303 formed of a lamination of the Ni layer and the Au layer is formed. Thus, the wiring structure 300 having the insulation layer 304, the via plugs 301 penetrating through the insulation layer 304, the pattern wiring 302 to be connected to the via plugs 301, and the connection layer 303 formed on the pattern wiring 302 can be formed.

Figure 3G:
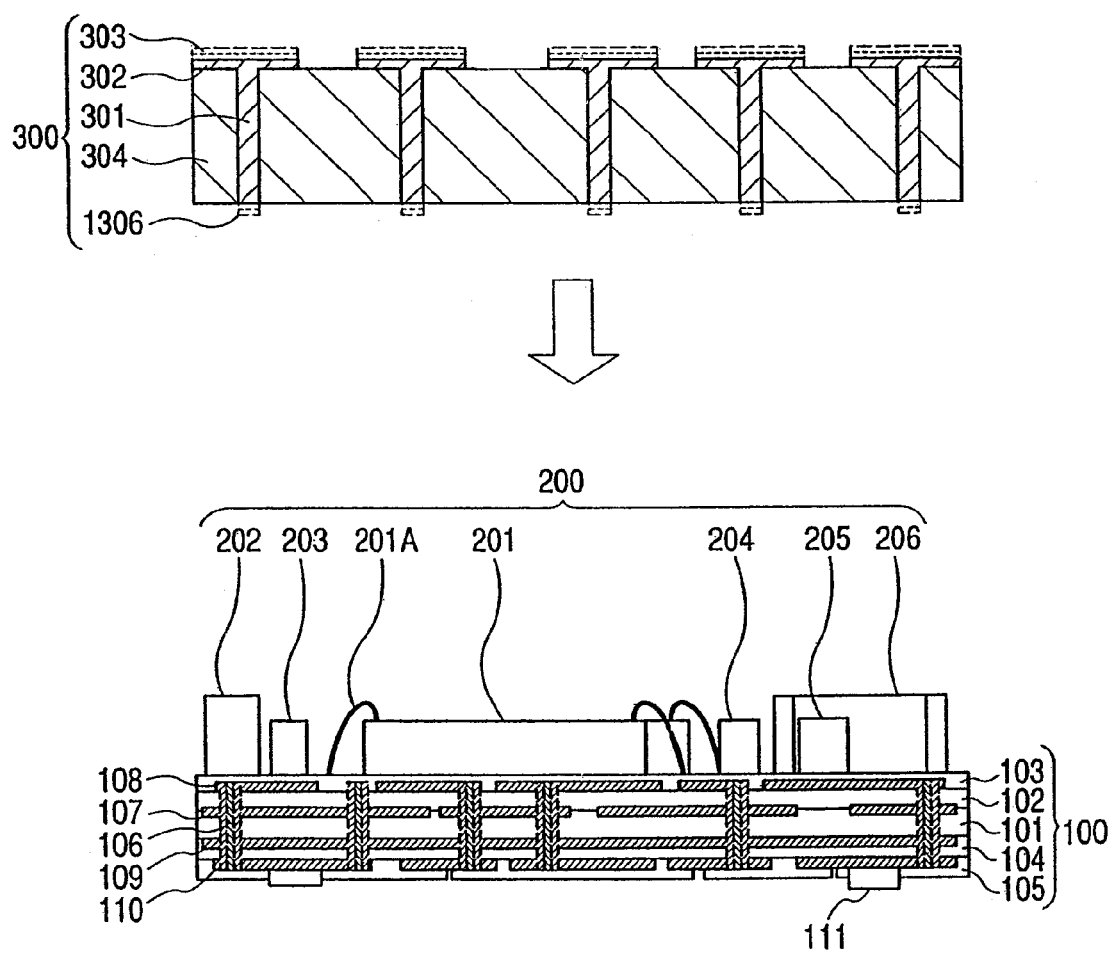
FIG. 3G is a view (seventh) showing the method for manufacturing the semiconductor device in accordance with Example

Then, in a step shown in FIG. 3G, the wiring structure 300 is bonded to the wiring substrate 100 including the radio communication module (the active element 201 and the passive elements 202 to 206) mounted thereon, described previously in connection with FIG. 2. In this case, the wiring structure 300 is applied with heat/pressure so as to be pressed against the wiring substrate 100, and thereby bonded to the wiring substrate 100.

For example, as the materials for forming the insulation layer 304 of the wiring structure 300, resin materials which alter in property (hardness) by heat such as thermosetting resins or thermoplastic resins are preferably used.

For example, in the case where a thermosetting resin is used as the material for forming the insulation layer 304, when the wiring structure 300 shown in FIG. 3F is formed, the insulation layer 304 may be rendered in a semi-cured state (the state in which it is not completely cured, but curing has proceeded to a certain degree from immediately after the formation of the insulation layer of FIG. 3C. Thereafter, in this step (FIG. 3G), the following procedure may be followed. The wiring structure 300 is stacked on the wiring substrate 100, and applied with heat/pressure, thereby to substantially completely cure the insulation layer 304 (curing is further allowed to proceed from the semi-cured state).

When a thermoplastic resin is used as the material for forming the insulation layer 304, the following procedure may be followed. The wiring structure 300 shown in FIG. 3F is formed. Then, in this step (FIG. 3G), the wiring structure 300 is stacked on the wiring substrate 100, and applied with heat/pressure. Thus, the insulation layer 304 is softened, so that the electronic components (the active elements 201 and the passive elements 202 to 206) are embedded in the insulation layer 304.

Further, the bonding is carried out such that the tip of each via plug 301 to be bonded is bonded to the pattern wiring 108 formed in the wiring substrate 100. When a bonding layer 1306 formed of a Au layer is formed at the tip of each of the via plugs 301 by plating or the like, bonding with the pattern wiring 108 becomes easy. Thus, this is preferable. Similarly, a bonding layer formed of a Au layer is preferably formed by plating or the like at the portions of the pattern wiring 108 corresponding to the via plugs 301. The bonding layers formed of an Au layer, respectively formed on the via plugs and the pattern wiring are bonded by thermo-compression.

The materials for forming the bonding layer are not limited to Au. For example, other metals (alloys) than Au, such as Cu may be used. For example, even by the use of a Au layer and a Cu layer, it is possible to carry out bonding by thermo-compression. Alternatively, it may also be configured such that the bonding layer has a lamination structure of different metals (alloys).

In this manner, the semiconductor device 400 shown in FIG. 2 can be manufactured. With the method for manufacturing the semiconductor device, the feature is as follows. The via plugs 301 erected on the electrically conductive layer 302A are formed. The via plugs 301 are embedded in the insulation layer 304 to form the wiring structure 300. Then, the wiring structure 300 is bonded to the wiring substrate 100 (module 200 above).

For this reason, it is possible to form via plugs large in aspect ratio more easily as compared with the method in which via holes are formed in an insulation layer, and an electrically conductive paste is embedded in the via holes with a printing method to form via holes, for example, as with the related-art method disclosed in JP2006-108451.

For example, as shown in this example, the radio communication module is configured to include, in addition to the active element, the passive elements larger in height from the mounting surface than the active element. For this reason, when a pattern wiring is formed as the overlying layer of the radio communication module, unfavorably, spreading of a plating solution creates a problem with the method according to a via-fill plating method, resulting in a difficulty.

On the other hand, with the manufacturing method in accordance with this example, it becomes possible to readily form a structure of a pattern wiring to be connected to a wiring substrate including a module mounted thereon as the overlying layer of the module including elements large in height from the mounting surface, such as a radio communication module.

Further, the method for manufacturing a semiconductor device in accordance with the present invention is not limited to the forgoing method. Various modifications/changes may be made. For example, not limited to the method in which the formation is carried out by etching, the via plugs may be formed by, for example, bonding projection-like electrically conductive members (pins) on the electrically conductive layer. Examples of such a manufacturing method will be described in Example 2 below.

EXAMPLE 2

A method for manufacturing a semiconductor device in accordance with Example 2 will be described step by step by reference to FIGS. 4A to 4G. However, the elements described previously are given the same reference numerals and signs, and the description may be omitted.

Figure 4A:
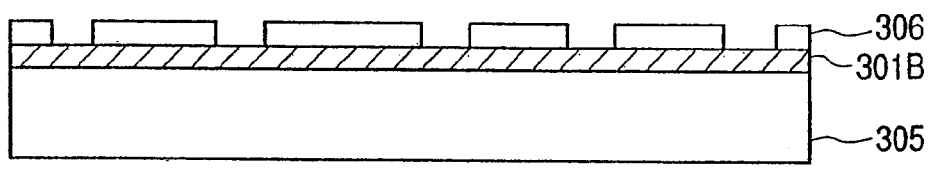
FIG. 4A is a view (first) showing a method for manufacturing a semiconductor device in accordance with Example 2.

First, in a step shown in FIG. 4A, on an electrically conductive layer 301B made of an electrically conductive material such as Cu on the fixing layer 305 formed of a film made of a resin or the like, a mask pattern 306 is formed. When the mask pattern 306 is formed, a resist layer is formed by bonding of a film, or coating, and then exposed to light/developed for the formation.

Figure 4B:
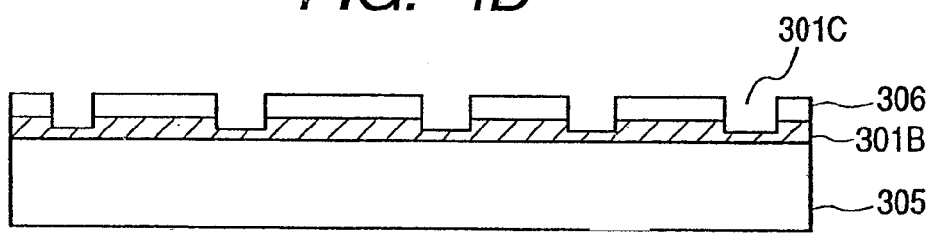
FIG. 4B is a view (second) showing the method for manufacturing the semiconductor device in accordance with Example 2.

Then, in a step shown in FIG. 4B, the portions of the electrically conductive layer 301B corresponding to the openings of the mask pattern 306 are etched to form each concave portion 301C.

Figure 4C:
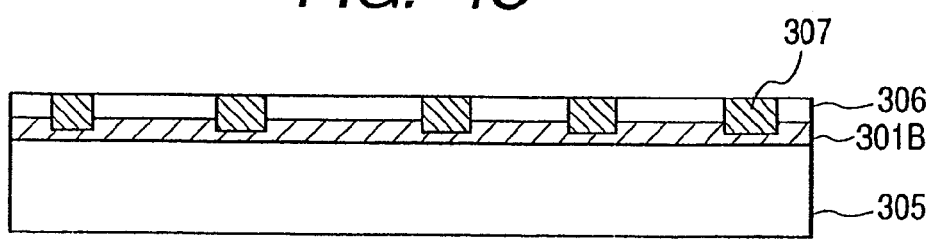
FIG. 4C is a view (third) showing the method for manufacturing the semiconductor device in accordance with Example 2.

Then, in a step shown in FIG. 4C, for example, a connection paste 307 made of, for example, solder is formed in the concave portion 301C by, for example, a printing method.

Figure 4D:
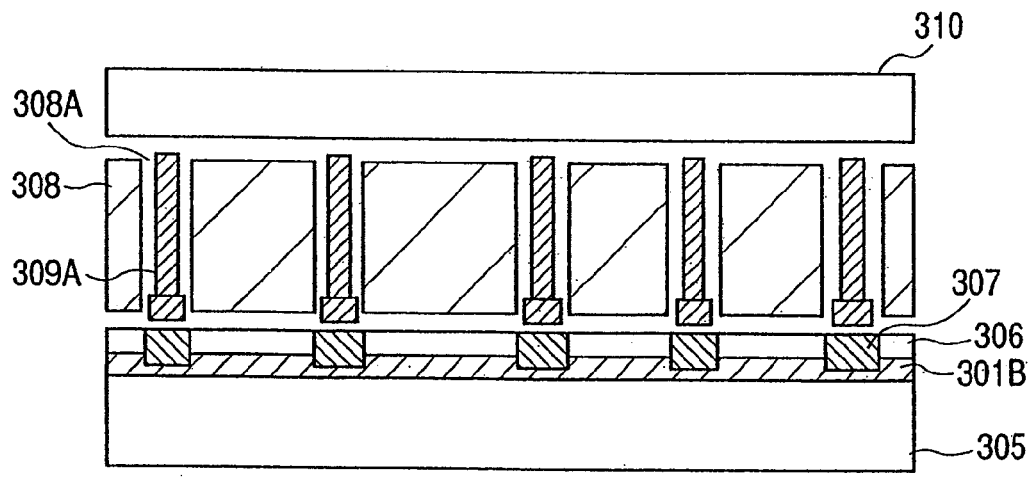
FIG. 4D is a view (fourth) showing the method for manufacturing the semiconductor device in accordance with Example 2.

Then, in a step shown in FIG. 4D, projection-like electrically conductive members 309A (such as pins) are bonded by the use of the connection paste 307 so as to be erected on the electrically conductive layer 301B. In this step, by using a jig 308 including hole portions 308A formed therein into each of which each electrically conductive member 309A is inserted, the electrically conductive members 309A are bonded. Each electrically conductive member 309A inserted into each hole portion 308A is bonded to the electrically conductive layer 301B in such a manner that one end thereof is pressed against the connection paste 307 (electrically conductive layer 301B). The other one end of the electrically conductive member 309A is pressed against the connection paste 307 by a plate-like pressurizing means 310. Further, if required, heating is preferably carried out to such a degree as to melt the connection paste 307.

Figure 4E:
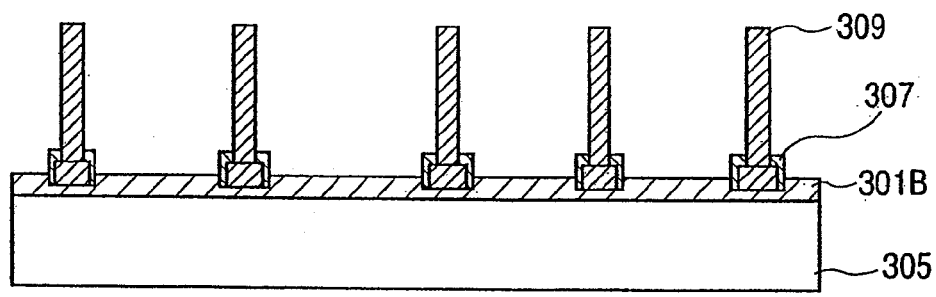
FIG. 4E is a view (fifth) showing the method for manufacturing the semiconductor device in accordance with Example 2.

Then, in a step shown in FIG. 4E, the jig 308 is removed, and further, the mask pattern 306 is removed (peeled off). Thus, projection-like electrically conductive members (via plugs) 309 erected on the electrically conductive layer 301B are formed.

Figure 4F:
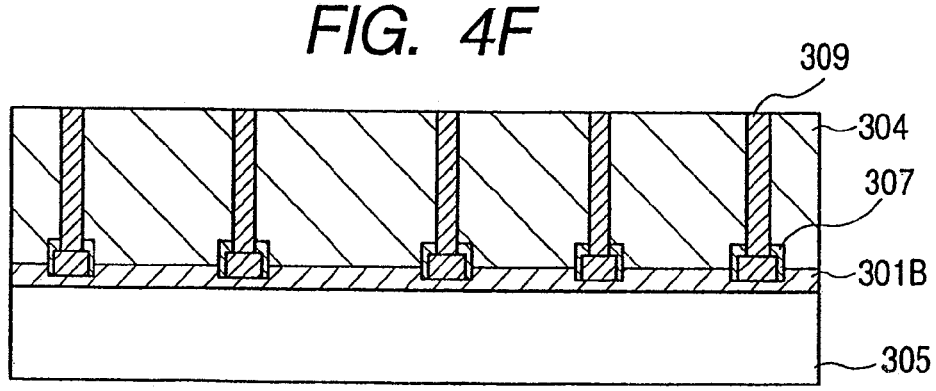
FIG. 4F is a view (sixth) showing the method for manufacturing the semiconductor device in accordance with Example 2.

Then, in a step shown in FIG. 4F, an insulation layer 304 formed of, for example, a build-up resin (such as an epoxy resin or a polyimide resin) is formed on the electrically conductive layer 301B so as to cover the periphery of the via plug 309. The insulation layer 304 can be formed by, for example, bonding a film resin, or coating a liquid resin. Further, the insulation layer 304 is applied with heat/pressure, thereby to be cured.

Figure 4G:
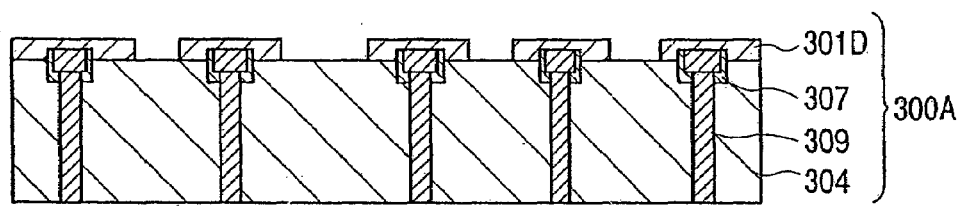
FIG. 4G is a view (seventh) showing the method for manufacturing the semiconductor device in accordance with Example 2.

Then, in a step shown in FIG. 4G, the fixing layer 305 is removed (peeled off). Then, with etching (e.g., wet etching) using a prescribed mask pattern (not shown) as a mask, the electrically conductive layer 301B is subjected to pattern etching. Thus, each pattern wiring (electrode pad) 301D connected to its corresponding via plug 309 is formed. Thus, it is possible to form a wiring structure 300A having the insulation layer 304, the via plugs (electrically conductive members) 309 penetrating through the insulation layer 304, and the pattern wiring (electrically conductive layer) 301D to be connected to each via plug 309. Incidentally, the following procedure may also be adopted. As with Example 1, for example, with a plating method, a Ni layer and a Au layer are sequentially formed on the pattern wiring (electrically conductive layer) 301D, so that a connection layer including a lamination of the Ni layer and the Au layer is formed.

Figure 4H:
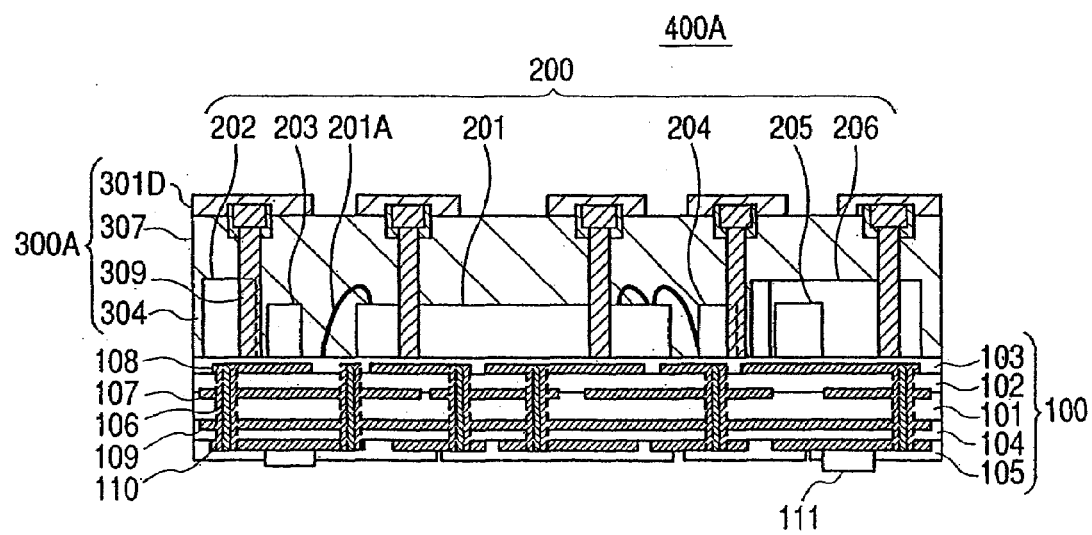
FIG. 4H is a view (eighth) showing the method for manufacturing the semiconductor device in accordance with Example 2.

Then, in a step shown in FIG. 4H, the wiring structure 300A is bonded to the wiring substrate 100 including the radio communication module (the active element 201, and the passive elements 202 to 206) mounted therein, described previously in connection with FIG. 2. In this case, the wiring structure 300A is applied with heat/pressure so as to be pressed against the wiring substrate 100, and thereby bonded to the wiring substrate 100.

The bonding is carried out such that the tip of each via plug 301 to be bonded is bonded to the pattern wiring 108 formed in the wiring substrate 100. When a bonding layer formed of a Au layer is formed at the tip of each of the via plugs 309 by plating or the like as in Example 1, bonding with the pattern wiring 108 becomes easy. Thus, this is preferable. Similarly, a bonding layer formed of a Au layer is preferably formed by plating or the like at the portions of the pattern wiring 108 corresponding to each via plug 309. Thus, it is possible to manufacture a semiconductor device 400A shown in this view.

With the manufacturing method in accordance with this example, in addition to performing the same effects as with the manufacturing method in accordance with Example 1, it is possible to form fine via plugs with more ease than with Example 1. Namely, in this example, the etchant for use in via plug formation (or an etching gas for dry etching) is not required to be used. Further, the step of forming a mask pattern is also unnecessary. For this reason, the method for manufacturing a semiconductor device becomes simple, which performs an effect of suppressing the manufacturing cost.

When this example and the invention disclosed in JP2004-71961 are compared with each other, in this example, the miniaturization of via plugs, or the formation of via plugs at a narrow pitch is easy.

In accordance with the invention disclosed in JP2004-71961, via plugs are formed by bonding wire on a substrate including elements mounted thereon. On the other hand, in the case of this example, a wiring structure is formed separately from a substrate including elements mounted thereon. Then, the wiring structure is bonded to the wiring substrate. The formation of via plugs is based on the method in which projection-like electrically conductive members are bonded to an electrically conductive layer.

In this example, there is no physical limitation on the space for plug formation due to arrangement of elements as in the case where via plugs are formed on a substrate including elements mounted thereon. Thus, it is possible to form via plugs at a narrow pitch. Further, as compared with a method by wire bonding, the method in which electrically conductive members are bonded is more advantageous for the miniaturization of via plugs.

EXAMPLE 3

Figure 5:
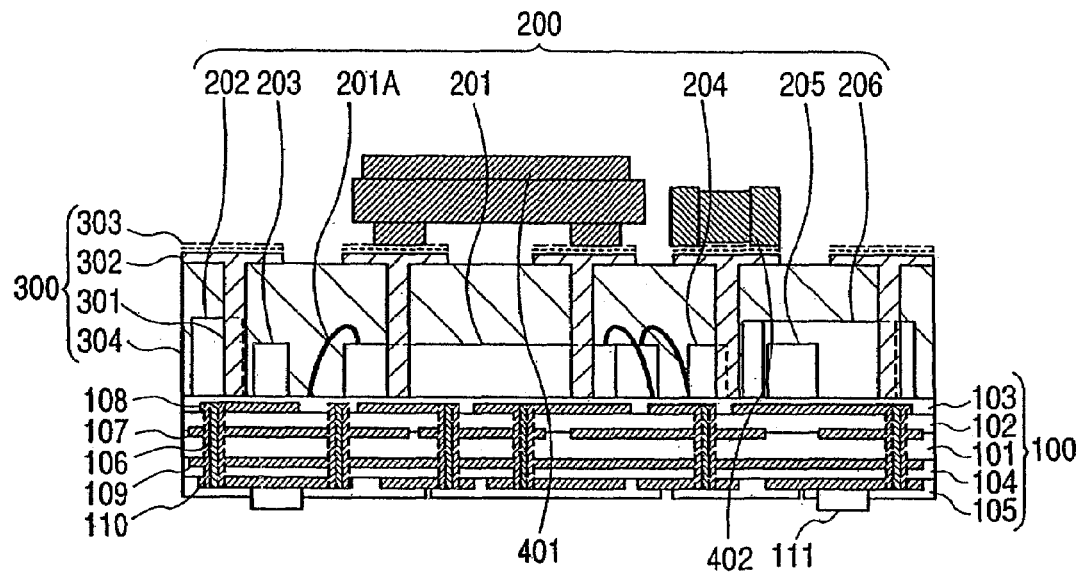
FIG. 5 is a view showing a method for manufacturing a semiconductor device in accordance with Example 3.

FIG. 5 shows a semiconductor device (method for manufacturing a semiconductor device) in accordance with Example 3. However, the elements described previously are given the same reference numerals and signs, and the description is omitted. Further, the elements not particularly described can be manufactured with the method according to Example 1.

By reference to FIG. 5, a semiconductor device 400B shown in this diagram is configured such that electronic components 401 and 402 are mounted on the pattern wirings (electrode pads) 302 in the semiconductor device 400 shown in FIG. 2 described in Example 1. The semiconductor device 400B in accordance with this example has a structure in which the electronic components 401 and 402 are further mounted as the overlying layer of the radio communication module 200.

For example, as the electronic component 401, a MEMS (micro electro mechanical system) element to be connected to a radio communication module for use can be used. Examples of the MEMS element include various sensors (such as a temperature sensor and an acceleration sensor). Further, a passive element (electronic component 402) for use in a driver IC of the MEMS element or the peripheral circuit may be mounted.

Alternatively, in the foregoing configuration, it may be configured such that the electronic components 401 and 402 and the radio communication module 200 are interchanged. Namely, the electronic components 401 and 402 may be mounted on the wiring substrate 100, and the radio communication module 200 may be mounted as the overlying layer of the electronic components 401 and 402.

EXAMPLE 4

Figure 6:
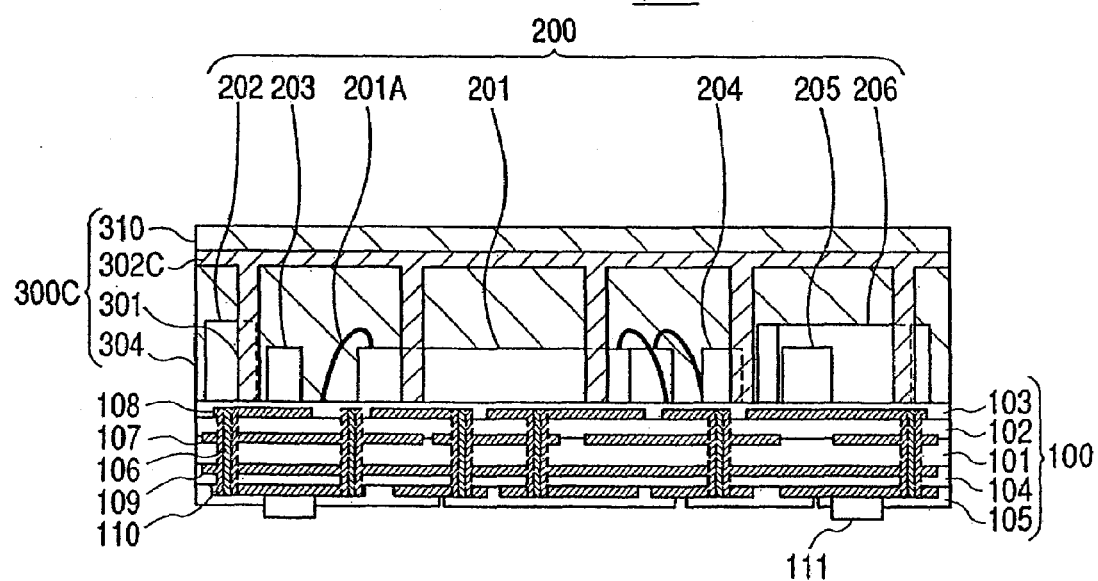
FIG. 6 is a view showing a method for manufacturing a semiconductor device in accordance with Example 4.

Further, FIG. 6 shows a semiconductor device (method for manufacturing a semiconductor device) in accordance with Example 4. However, the elements described previously are given the same reference numerals and signs, and the description is omitted. Further, the elements not particularly described can be manufactured with the method according to Example 1.

By reference to FIG. 6, a semiconductor device 400C shown in this diagram is wherein an electrically conductive layer 302C corresponding to the pattern wiring 302 of the semiconductor device 400 of Example 1 forms a shield for shielding the radio communication module 200. Namely, a wiring structure 300C corresponding to the wiring structure 300 of Example 1 is configured so as to include a shield (the electrically conductive layer 302C).

For configuring the semiconductor device in accordance with this example, it is essential only that the following procedure is carried out. In the step of etching the electrically conductive layer 302A shown in FIG. 3E, etching is carried out so that the electrically conductive layer has a shape forming a shield. Alternatively, etching is not carried out, and the electrically conductive layer is allowed to configure a shield as it is.

The semiconductor device 400C in accordance with this example becomes a semiconductor device with less malfunctions and high reliability because the effects of noise are eliminated.

EXAMPLE 5

Figure 7:
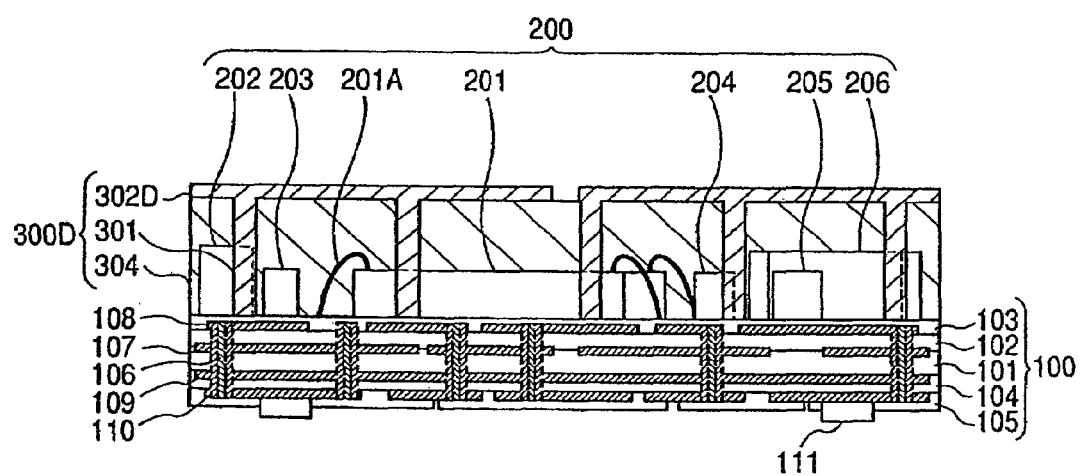
FIG. 7 is a view showing a method for manufacturing a semiconductor device in accordance with Example 5.

Further, FIG. 7 shows a semiconductor device (method for manufacturing a semiconductor device) in accordance with Example 5. However, the elements described previously are given the same reference numerals and signs, and the description is omitted. Further, the elements not particularly described can be manufactured with the method according to Example 1.

By reference to FIG. 7, a semiconductor device 400D shown in this diagram is wherein the electrically conductive layer 302D corresponding to the pattern wiring 302 of the semiconductor device 400 of Example 1 configures an antenna to be connected to the radio communication module 200. Namely, a wiring structure 300D corresponding to the wiring structure 300 of Example 1 is configured so as to include an antenna (the electrically conductive layer 302D)

For configuring the semiconductor device in accordance with this example, it is essential only that the following procedure is carried out. In the step of etching the electrically conductive layer 302A shown in FIG. 3E, etching is carried out so that the electrically conductive layer is in a shape configuring an antenna.

Up to this point, the preferred embodiments of the present invention were described in details. However, the present invention is not limited to such specific embodiments, and various modifications/changes are possible within the scope of the gist described in the appended claims.

For example, the wiring structure formed as the overlying layer of the radio communication module is not limited to a one-layer structure, and it may be formed so as to be in a multilayer (e.g., two-layer or three-layer). Further, the module formed as the underlying layer (on the wiring substrate 100) is not limited to the radio communication module, and various other modules are also acceptable.

Figure 8A:
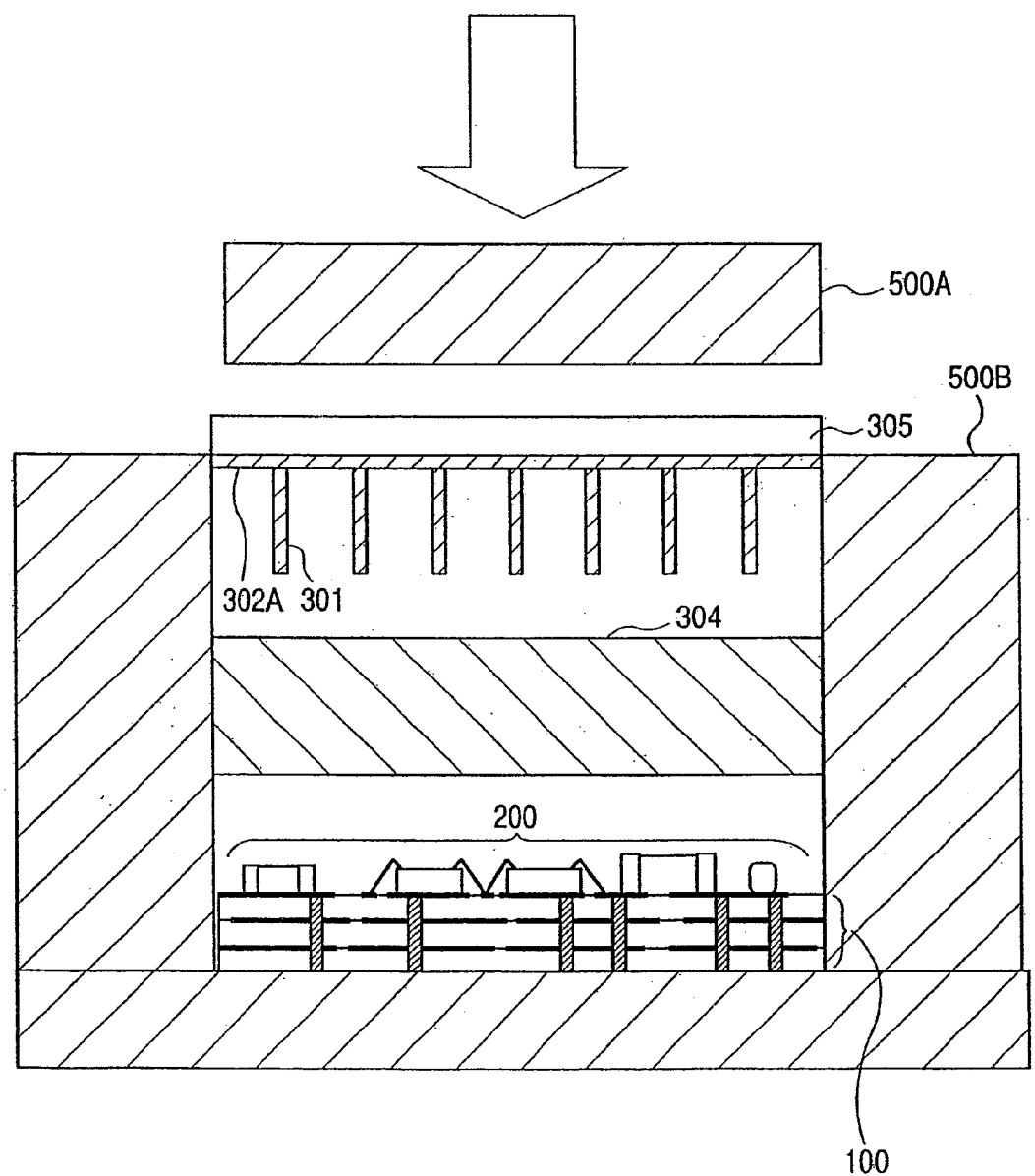
FIGS. 8A to 8E are views showing a method for manufacturing a semiconductor device in accordance with a modified example of Example 1.
Figure 8B:
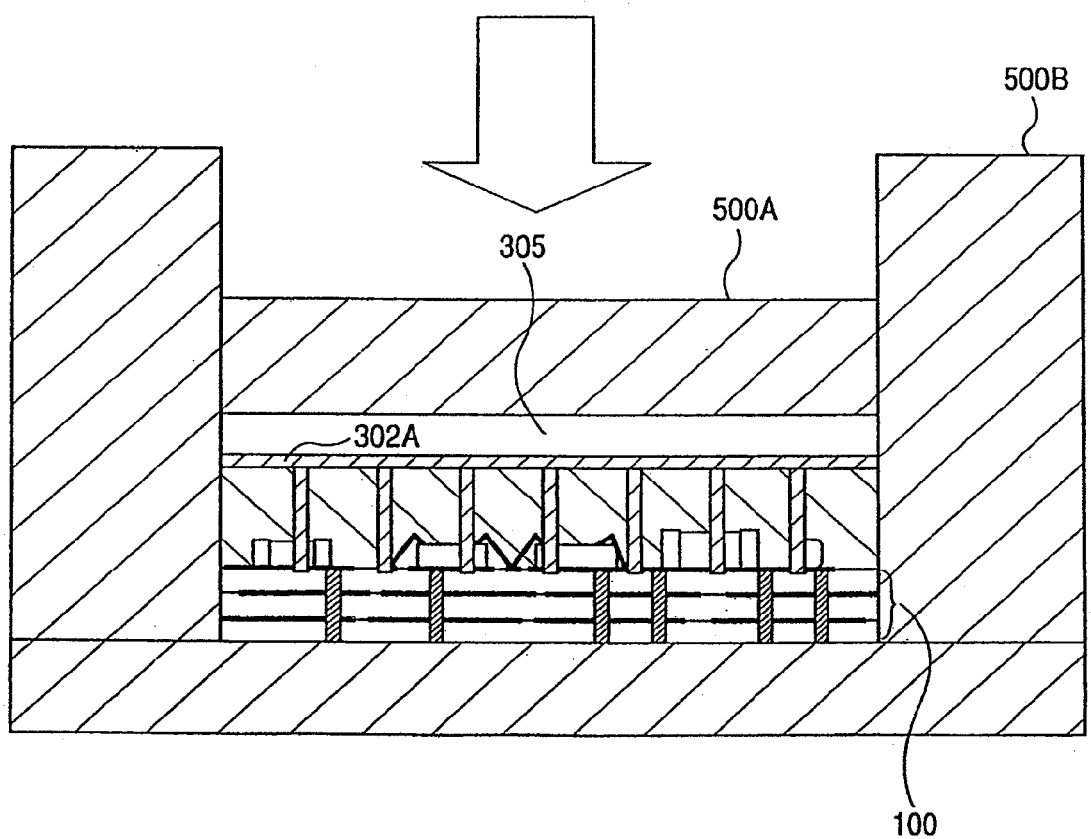
Figure 8C:
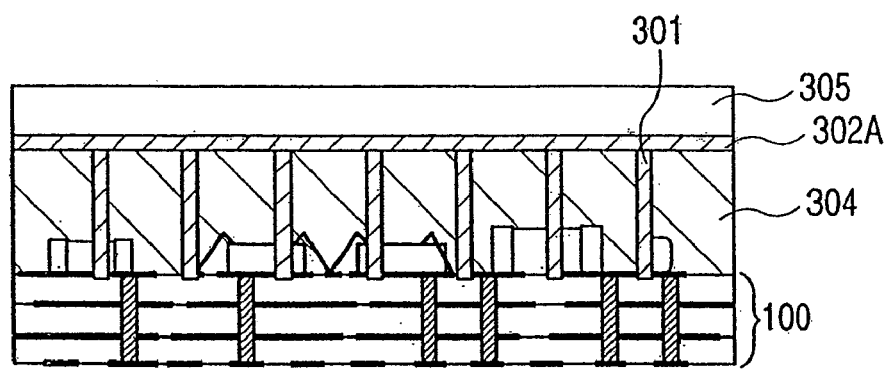
Figure 8D:
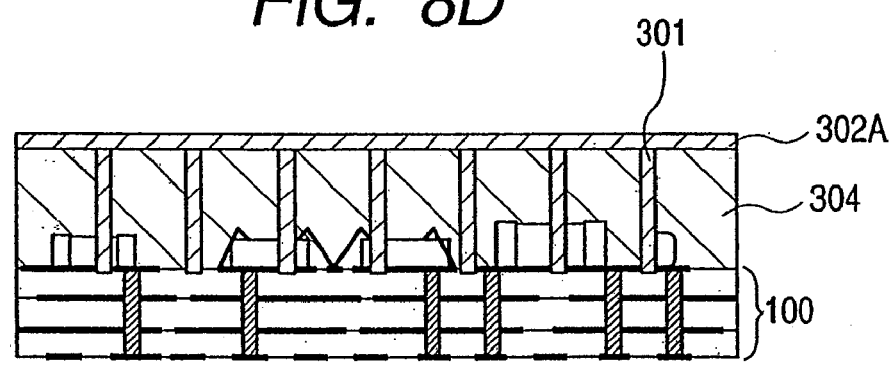
Figure 8E:
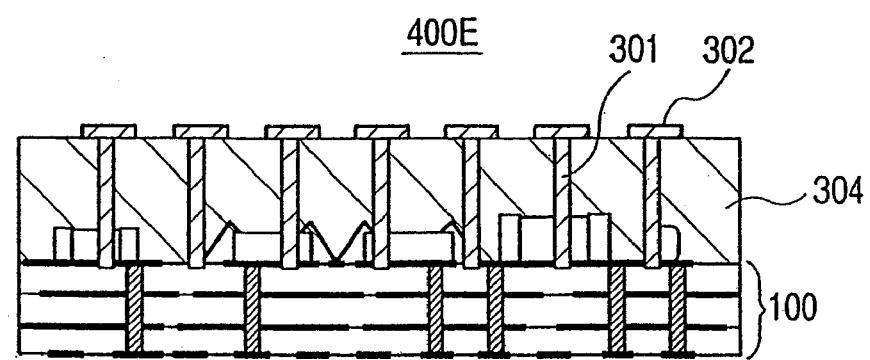

Alternatively, the insulation layer in which the via plugs are embedded may be formed in the following manner. In the step of bonding the via plugs to the wiring substrate, a film insulation layer is inserted between the via plugs and the wiring substrate, and then cured (See FIGS. 8A to 8E). Namely, after the via plug 301 is formed on the electrically conductive layer 302A on the fixing layer 305 in FIG. 3B (which is referred as via plug structure), the via plug structure (305, 301, 302A) is set in a lower jig 500B together with the insulation layer 304 and the wiring substrate 100 including the radio communication module 200 mounted thereon in a state that the insulation layer 304 is inserted between the via plug structure and the wiring substrate 100 (FIG. 8A). In FIG. 8B, the via plug structure is applied with heat/pressure by an upper jig 500A so as to be pressed against to the wiring substrate 100, and thereby bonded to the wiring substrate 100 via the insulating layer 304. After the insulating layer 304 is cured, the upper and lower jigs 500A, 500B are removed (FIG. 8C), and the fixing layer 305 is removed (peeled off) (FIG. 8D). The electronically conductive layer 302A is subjected to pattern etching by etching (e.g., wet etching) using a prescribed mask pattern (not shown) as a mask, if necessary, to manufacture a semiconductor device 400E (FIG. 8E).

In accordance with the present invention, it becomes possible to provide a method for manufacturing a semiconductor device whereby the semiconductor device including electronic components mounted therein is reduced in size.

What is claimed is:

1. A method for manufacturing a semiconductor device comprising:
    a step of forming a plurality of via plugs erected on an electrically conductive layer, and embedding the via plugs in an insulation layer to form a wiring structure;
    a step of forming a bonding layer on a tip of the via plugs;
    a step of forming a bonding layer on a portion of a pattern wiring of a wiring substrate to be connected to the tip of the via plugs; and
    a step of bonding the wiring structure to a surface of the wiring substrate on which an electronic component is mounted thereon, wherein an entire wiring substrate is provided at one side of the electronic component, and heat/pressure is applied to the wiring structure so as to be pressed against the wiring substrate to connect the tip of the via plugs of the wiring structure to the pattern wiring of the wiring substrate, wherein
    surfaces of the electronic component other than a surface that is in contact with the wiring substrate are embedded in the insulation layer that embeds the via plugs of the wiring structure, a wherein the electronic component includes an active element and an passive element forming a radio communication module.

2. The method for manufacturing a semiconductor device according to claim 1, wherein the electrically conductive layer forms a shield for shielding the radio communication module.

3. The method for manufacturing a semiconductor device according to claim 1, further comprising:
    a step of patterning the electrically conductive layer, and forming an antenna to be connected to the radio communication module.

4. The method for manufacturing a semiconductor device according to claim 1, further comprising:
    a step of patterning the electrically conductive layer, and forming an electrically conductive pattern to be connected to the radio communication module.

5. The method for manufacturing a semiconductor device according to claim 4, further comprising:
    a step of mounting an electronic component to be connected to the electrically conductive pattern.

6. The method for manufacturing a semiconductor device according to claim 1, wherein, in the step of forming the wiring structure, an electrically conductive to-be-etched layer is subjected to pattern etching to form the electrically conductive layer and the via plugs.

7. The method for manufacturing a semiconductor device according to claim 1, wherein, in the step of forming the wiring structure, a projection-like electrically conductive member is bonded to the electrically conductive layer to form the via plugs.

8. A method for manufacturing a semiconductor device comprising:
    a step of forming a plurality of via plugs erected on an electrically conductive layer to form a via plug structure;
    a step of forming a bonding layer on a tip of the via plugs of the via plug structure;
    a step of forming a bonding layer on a portion of a pattern wiring of a wiring substrate to be connected to the tip of the via plugs of the via plug structure; and
    a step of bonding the via plug structure to a surface of the wiring substrate on which an electronic component is mounted thereon while inserting an insulating layer between the via plug structure and the wiring substrate, wherein an entire wiring substrate is provided at one side of the electronic component, and heat/pressure is applied to the via plug structure so as to be pressed against the wiring substrate, to connect the tip of each via plug of the via plug structure to the pattern wiring of the wiring substrate,
    wherein the via plugs of the via plug structure and surfaces of the electronic component other than a surface that is in contact with the wiring substrate are embedded in the insulating layer, wherein the electronic component includes an active element and an passive element forming a radio communication module.

* * * * *